United States Patent [19]

Satoh

[11] Patent Number: 5,707,729
[45] Date of Patent: Jan. 13, 1998

[54] ADHESIVE FOR COPPER FOILS AND ADHESIVE-BACKED COPPER FOIL

[75] Inventor: Tetsuro Satoh, Ageo, Japan

[73] Assignee: Mitsui Mining & Smelting Co., Ltd., Tokyo, Japan

[21] Appl. No.: 524,802

[22] Filed: Sep. 7, 1995

[30] Foreign Application Priority Data

Sep. 13, 1994 [JP] Japan .................. 6-243430

[51] Int. Cl.$^6$ .................. B32B 7/12; B32B 27/38
[52] U.S. Cl. .................. 428/344; 428/355 EP; 428/355 BL; 428/413; 428/418; 428/458; 428/462; 428/423.1; 428/921; 525/108; 525/119; 525/111; 525/115
[58] Field of Search .................. 428/418, 344, 428/413, 349, 355 EP, 355 BL, 921, 458, 462, 423.1; 525/522, 529, 530, 533, 911, 449, 108, 119, 115, 111

[56] References Cited

U.S. PATENT DOCUMENTS

| | | | |
|---|---|---|---|
| 3,172,921 | 3/1965 | Flowers | 525/58 |
| 3,894,113 | 7/1975 | Pagel | 260/836 |
| 3,932,689 | 1/1976 | Wantanabe et al. | 428/418 |
| 4,582,564 | 4/1986 | Shanefield et al. | 428/418 |

FOREIGN PATENT DOCUMENTS

| | | |
|---|---|---|
| 1087667 | 3/1989 | Japan. |
| 6128547 | 5/1994 | Japan. |

Primary Examiner—Paul J. Thibodeau
Assistant Examiner—D. Lawrence Tarazano
Attorney, Agent, or Firm—Morrison Law Firm

[57] ABSTRACT

An adhesive composition and foils coated with the adhesive, wherein the adhesive consisting essentially of: (I) a fist amount of a non-modified epoxy resin and a second amount of a rubber-modified epoxy resin in a total amount of 60–100 parts by weight, wherein the amount of rubber-modified epoxy resin is 0.5 to 20 parts by weight; (II) 5–30 parts by weight of a polyvinyl acetal resin; and optionally contains (III) at least one resin selected rom the group consisting of blocked isocyanate resins, polyester resins, polyester resins, melamine resins and urethane resins. The adhesive coating can optionally contain inorganic fillers, fire retardants, and curing agents.

14 Claims, No Drawings

ADHESIVE FOR COPPER FOILS AND ADHESIVE-BACKED COPPER FOIL

BACKGROUND OF THE INVENTION

1. Field of the Invention

This invention relates to an adhesive for copper foils and also to an adhesive-backed copper foil, which are useful for the preparation of a laminate comprising a copper foil and a base sheet such as a metallic sheet or a plastics sheet.

2. Prior Art

Adhesives for copper foils which have conventionally been used comprise as the main component a polyvinyl acetal resin which is modified with a phenol resin or melamine resin. These adhesives or resins are dissolved in an organic solvent such as toluene or methyl ethyl ketone for use as an adhesive varnish. This adhesive varnish is coated on copper foils, dried and then semi-cured in a heating furnace thereby to industrialize the production of adhesive-coated copper foils free of stickiness at room temperatures. This stickiness-free adhesive-backed copper foil is used in combination with a prepreg which is prepared by impregnating a paper substrate, glass cloth or the like with a thermosetting resin such as a phenol resin.

On the other hand, various methods have been used for bonding together a copper foil and a base sheet such as a metallic sheet or a plastics sheet. They include a method which comprises superimposing a base sheet and an adhesive-backed copper foil one upon the other and then pressing them together, a method which comprises coating a non- solvent type adhesive composition composed of an epoxy resin incorporated with a curing agent onto a copper foil or a base sheet immediately before bonding the copper foil and base sheet together, and a method which comprises wrapping an adhesive composition in a carrier film to prepare a film-like adhesive and then interposing the film-like adhesive between a copper foil and a base sheet.

Since an adhesive used in the conventional adhesive-backed copper foil is one containing as the main component a polyvinyl acetal resin, the fluidity of the adhesive is so poor that it is difficult to press-bond the copper foil onto a base sheet with a press or heat rolls within a short period of time. It is of course possible from the technical viewpoint to use an adhesive containing an extremely reduced amount or none of a polyvinyl acetal resin. However, with such an adhesive, the flexing properties of the resulting adhesive layer will be significantly reduced, thus making it difficult to handle the resulting adhesive-backed copper foil in actual use. Accordingly, such an adhesive is of no practical use.

Moreover, the phenol resin and melamine resin included as components in the adhesive require a high temperature of not less than 150° C. for curing the resins. Further, during curing, these resins release by-products such as water and formaldehyde due to condensation reactions. Therefore, it requires the application of pressure for a long period of time to bond the copper foil and base material together. Instead of an adhesive-backed foil, a liquid adhesive may be applied to the base material to effect a bond between it and a non-adhesive-backed copper foil, or else a film-like adhesive used between a copper foil and base material for their adhering makes it possible to achieve the adhesion by application of heat and pressure for a short period of time; the above cases raise the problems of the pot-life of the applied liquid adhesive or the need of an additional step to remove the carrier film of the film-like adhesive, whereby the above adhesion methods are not attractive from the standpoint of workability and cost in an industrial environment.

SUMMARY OF THE INVENTION

This invention has been made in view of these conventional limitations. The primary object of this invention is to provide an adhesive for copper foils which is easy to handle, enables a copper foil to be press-bonded onto a base sheet such as a metallic sheet, a plastics sheet or a glass reinforced plastics sheet at a lower temperature and pressure than those employed for press-bonding in the conventional adhesive-backed copper foil, and will exhibit excellent adhesion and heat resistance after curing even if it is cured without applying a pressure, and to provide an adhesive-backed copper foil prepared by coating the adhesive on the surface of a copper foil.

The above object of the present invention may be achieved by the provision of an adhesive for copper foils which comprises (I) 60 to 100 parts by weight of the whole epoxy resin in which 0.5 to 20 parts by weight of a rubber-modified epoxy resin are included, and (II) 5 to 30 parts by weight of a polyvinyl acetal resin. The term "the whole epoxy resin" used in this invention is defined to include both of an ordinary non-modified epoxy resin and a rubber-modified epoxy resin.

The copper foils used in the adhesive-backed copper foils include rolled copper foils and electrodeposited copper foils. It is preferable to subject at least one surface of the copper foils to surface-toughening treatment and corrosion prevention treatment in order to enhance adhesion of the foils.

There is no limitation on the thickness of the copper foil, but a copper foil having a thickness ranging generally from 0.009 mm to 0.1 mm, more generally from 0.018 mm to 0.035 mm, may be preferably used. There is also no restriction placed on a method for the corrosion prevention treatment.

The epoxy resins useful in this invention include a bisphenol A-type epoxy resin, a bisphenol F-type epoxy resin, a novolak-type epoxy resin, o-cresol novolak-type epoxy resin, a brominated epoxy resin such as diglycidyl ether of tetrabromobisphenol A, triglycidyl isocyanurate, tetrakis (glycidyloxyphenyl) ethane, epoxidized polybutadiene, a glycidyl amine compound such as N,N-diglycidyl aniline and a glycidyl ester compound such as tetrahydrophthalate diglycidyl ester. These epoxy resins may be used singly or jointly. There is no specific restriction placed on the polymerization degree or epoxy equivalent of these epoxy resins.

The rubber-modified epoxy resins used herein include reaction products between the above-mentioned low molecular weight epoxy resin and a compound selected from butadiene rubber having a terminal carboxyl group, acrylonitrile-butadiene copolymers and isoprene rubber.

Preferable curing agents for these epoxy resins include well-known dicyandiamide, a latent curing agent such as organic hydrazides and imidazoles, a phenol novolak resin difficultly curable at room temperature and cresol novolak resin. These curing agents may be used singly or jointly. Further, it is possible to additionally use a reaction accelerator such as a tertiary amine or triphenyl phosphine.

Polyvinyl acetal resins are effective for adjusting the viscosity of the resulting adhesives. There is no restriction placed on the polymerization degree of polyvinyl alcohol to be used as a raw material for the polyvinyl acetal resins, on the kind of acetal group, existence or non-existence of a modifying agent, the amount of the modifying agent and the concentration of residual hydroxyl group.

The adhesive for copper foils according to this invention includes 60 to 100 parts by weight of the whole epoxy resin, the amount including 0.5 to 20 parts by weight of a rubber-modified epoxy resin, and 5 to 30 parts by weight of a polyvinyl acetal resin. Preferably, the adhesive includes 70 to 90 parts by weight of the whole epoxy resin, the amount including 5 to 15 parts by weight of a rubber-modified epoxy resin, and 5 to 20 parts by weight of a polyvinyl acetal resin.

If the amount of the whole epoxy resin including the rubber-modified epoxy resin is less than 60 parts by weight, it would be difficult to proceed with the curing of the adhesive without applying pressure after press-bonding the copper foil onto the base sheet. However, it is just a copper foil with an adhesive that does not require the extended application of pressure which is the object of this invention. Meanwhile, if the amount of the rubber-modified epoxy resin to be used is less than 0.5 parts by weight, the resulting adhesive layer will become fragile whereby it is made difficult to handle. On the other hand, if the amount of the rubber-modified epoxy resin to be used exceeds 20 parts by weight, this resin will be deteriorated in compatibility with other resins thereby making it difficult for the resulting adhesive to be formed into a varnish. If the content of the polyvinyl acetal resin exceeds 30 parts by weight, the fluidity of the adhesive will be adversely affected so that the press-bonding of a copper foil therewith under a low temperature and a low pressure becomes difficult. On the other hand, if the amount of the polyvinyl acetal resin is less than 5 parts by weight, the resultant adhesive will become too fluid so that it is squeezed out during press-bonding.

The adhesive including the resinous components as mentioned above is coated on one of the surfaces of a copper foil and then heated to semi-cure the adhesive, thereby achieving the intended adhesive-backed copper foil. If required at this point, a comparatively inexpensive organic solvent such as industrially cheap methanol, acetone, methyl ethyl ketone or toluene may be used to dissolve the adhesive therein before coating the adhesive onto the copper foil.

It is also possible according to this invention to incorporate into the adhesive a fire retardant such as a bromine compound or antimony compound, and an inorganic filler such as talc or powdered silica, in addition to the components mentioned above. Additionally, a polyester resin, phenol resin, melamine resin and/or urethane resin may be added to the adhesive if they are capable of being chemically combined with the epoxy resin. These additional resins are effective in adjusting the viscosity of the adhesive and also in lowering the manufacturing cost of the adhesive.

The base material to be used in combination with the adhesive of this invention includes a plastics film, a printed wiring board provided thereon with an inner circuit, a plywood for decorative boards or a ceramic board for electric circuit.

Since the adhesive for copper foils of this invention contains an epoxy resin in a larger amount than a polyvinyl acetal resin, it exhibits high fluidity even at a relatively low temperature, thereby making it possible to perform the press-bonding of a copper foil with the adhesive by a press or a heat roll within a short period of time. Further, since the epoxy resin does not generate by-products therefrom during the curing thereof, the curing can still proceed after the press-bonding of the copper foil even if no pressure is applied to effect the bonding, resulting in a cured product excellent in adhesiveness and heat resistance. The deterioration of flexibility of the adhesive layer due to the quantitative reduction of the polyvinyl acetal resin can be effectively prevented by the addition of a rubber-modified epoxy resin in a suitable amount.

DESCRIPTION OF THE PREFERRED EMBODIMENTS

This invention will be better understood by the following Examples and Comparative Examples.

EXAMPLE 1

Methyl ethyl ketone was added as an organic solvent to a mixture comprising 10 parts by weight of a rubber-modified epoxy resin (trade name: EPICLON TSR-930, produced by Dai Nippon Ink Co., Ltd.), 50 parts by weight of an epoxy resin (trade name: EPOTOHTO YD-128, produced by Tohto Kasei Co., Ltd.), 20 parts by weight of another epoxy resin (trade name: D.E.R438, produced by Dow Chemical Japan Co.), 12 parts by weight of a mixed solution consisting of dicyandiamide (reagent) and dimethylformamide (mixing weight ratio: 1:3), 0.2 parts by weight of dimethylbenzylamine (reagent) as an accelerator, and 20 parts by weight of a polyvinyl acetal resin (trade name: DENKA BUTYRAL #5000A, produced by Denki Kagaku Kogyo Co., Ltd.), thereby to obtain an adhesive varnish containing 80% by weight of solid matter.

The adhesive varnish thus prepared was coated on the matte surface of an electrodeposited copper foil (35 µm in thickness, a product of Mitsui Mining & Smelting Co., Ltd.), air-dried and subsequently heated at 130° C. for 5 minutes to produce an adhesive-backed copper foil with an adhesive thickness of 30 to 40 µm.

EXAMPLE 2

A mixture comprising 15 parts by weight of a rubber-modified epoxy resin (trade name: EPOTOHTO YR-207, produced by Tohto Kasei Co., Ltd.), 25 parts by weight of an epoxy resin (trade name: EPOMIC R-304, produced by Mitsui Petrochemical Co., Ltd.), 20 parts by weight of another epoxy resin (trade name: EPOTOHTO YDCN-704P, produced by Tohto Kasei Co., Ltd.), 15 parts by weight of a curing agent for an epoxy resin (trade name: PHENOLITE VH-4170, produced by Dai Nippon Ink Co., Ltd.), 15 parts by weight of a polyvinyl acetal resin (trade name: DENKA BUTYRAL #5000A, produced by Denki Kagaku Kogyo Co., Ltd.) and 10 parts by weight of a blocked isocyanate resin (trade name: MILLIONATE MS-50, produced by Nihon Polyurethane Co., Ltd.) was uniformly dissolved in methyl ethyl ketone thereby to obtain an adhesive varnish containing 60% by weight of solid matter.

The adhesive varnish thus prepared was coated on the matte surface of an electrodeposited copper foil (35 µm in thickness, a product of Mitsui Mining & Smelting Co., Ltd.) air-dried and subsequently heated at 130° C. for 5 minutes to produce an adhesive-backed copper foil with an adhesive thickness of 30 to 40 µm on the matte surface of the copper foil.

COMPARATIVE EXAMPLE 1

A mixture comprising 20 parts by weight of an epoxy resin (trade name: EPOTOHTO YDCN-704P, produced by said Tohto Kasei Co.), 50 parts by weight of a polyvinyl acetal resin (trade name: DENKA BUTYRAL #5000A, produced by said Denki Kagaku Kogyo Co.) and 30 parts by weight of a resol phenolic resin (trade name: SHONOL BLS-364, produced by Showa High Molecular Co., Ltd.), was uniformly dissolved in methyl ethyl ketone, thereby obtaining an adhesive varnish containing 20% by weight of solid matter.

The adhesive varnish thus prepared was coated on the roughened surface of an electrodeposited copper foil (35 µm in thickness, a product of said Mitsui Co.) air-dried and subsequently heated at 130° C. for 5 minutes to produce an adhesive-backed copper foil with an adhesive thickness of 30 to 40 μm.

COMPARATIVE EXAMPLE 2

The procedure of Example 1 was repeated except that the amount of EPOTOHTO YD-128 (said Tohto Kasei Co.) was changed from the 50 parts by weight to 30 parts by weight, and the amount of DENKA BUTYRAL #5000A (said Denki Kagaku Kogyo Co.) was changed from the 20 parts by weight to 40 parts by weight, thereby obtaining an adhesive varnish containing 80% by weight of solid matter.

Then, the adhesive varnish thus prepared was used in the same manner as in Example 1, thereby obtaining a copper foil provided with an adhesive layer.

COMPARATIVE EXAMPLE 3

A mixture comprising 100 parts by weight of an epoxy resin (trade name: EPICLON 1050-75X, produced by said Dai Nippon Ink Co.), 2 parts by weight of a curing agent for the epoxy resin (trade name: CURESOL 2MA-OK, produced by Shikoku Kasei Co., Ltd.) and 2 parts by weight of an anti-settling agent (trade name: AEROSIL #300, produced by Nippon Aerosil Co., Ltd.), was uniformly dispersed using a three-roll mill and then incorporated with methyl ethyl ketone, thereby obtaining an adhesive varnish containing 70% by weight of solid matter.

Then, the adhesive varnish thus prepared was coated on matte surface of an electrodeposited copper foil (35 μm in thickness, a product of said Mitsui Co.) air-dried and subsequently heated at 140° C. for 5 minutes to produce an adhesive-backed copper foil with an adhesive thickness of 30 to 40 μm.

The adhesive-backed copper lolls prepared in Examples 1 and 2, as well as in Comparative Examples 1 to 3 were evaluated for the flexibility of their adhesive layer in accordance with JIS K 5400. The diameter of a spindle used in this evaluation was 10 mm. As base materials or substrates, 1 mm-thick silicon steel plates were employed. The base material and each of the above adhesive-backed copper foils were superimposed one upon the other so that the adhesive layer was contacted with the base material, after which the whole was pressed with a hot press at 100° C. and a pressure of 100 Kgf/cm² for 60 seconds. After being removed from the hot press, the copper-laminated steel plate was cut into two halves. One of them was measured for its peel strength by striping the copper foil from the base material by hand, while the other was heated to 200° C. for 30 minutes to cure the adhesive without the application of pressure. After being cured, the copper-laminated steel plate was evaluated for the presence or absence of any blisters generated. The copper-laminated steel plates having no blisters generated, were further measured for their peel strength and soldering heat resistance in accordance with JIS C 6481. The results are shown in Table 1.

As explained above, the copper foil having an adhesive layer of this invention can be handled as easily as the conventional adhesive-backed copper foil, and can be press-bonded to a base material at lower temperature and pressure than for conventional adhesive-backed foils. Moreover, it is apparent that the adhesive-backed copper foil will, after being press-bonded to the base material, allow the curing of the adhesive layer to proceed even if no pressure is applied thereon, resulting in a cured product which is excellent in adhesiveness and heat resistance.

TABLE 1

Unit: Part by weight

| | | Ex. 1 | Ex. 2 | Comp. Ex. 1 | Comp. Ex. 2 | Comp. Ex. 3 |
|---|---|---|---|---|---|---|
| components | rubber-modified epoxy resins | | | | | |
| | EPICLON TSR-930 | 10 | | | 10 | |
| | EPOTOHTO YR-207 | | 15 | | | |
| | epoxy resins | | | | | |
| | EPOTOHTO YD-128 | 50 | | | 30 | |
| | D.E.R 438 | 20 | | | 20 | |
| | EPICLON 1050-75X | | | | | 100 |
| | EPOMIC R-304 | | 25 | | | |
| | EPOTOHTO YDCN-704P | | 20 | 20 | | |
| | curing agents or curing accelerator | | | | | |
| | dicyandi-amide (25%) | 12 | | | 12 | |
| | CURESOL 2MA-OK | | | | | 2 |
| | PHENO-LITE VH-4170 | | 15 | | | |
| | dimethyl-benzylamine | 0.2 | | | 0.2 | |
| | polyvinyl acetal resin | | | | | |
| | DENKA BUTYRAL #5000A | 20 | 15 | 50 | 40 | |
| | other resins or inorganic filler | | | | | |
| | MILLIO-NATE MS-50 | | 10 | | | |
| | SHONOL BLS-364 | | | 30 | | |
| | AEROSIL #300 | | | | | 2 |
| results | flexibility of the coated adhesive | good | good | good | good | no good |
| | strength of press-bonding | good | good | no good | no good | good |
| | blister after curing | good | good | no good | no good | good |
| | peel strength (Kgf/cm²) | 2.05 | 1.86 | impossible to measure due to blister | | 1.82 |
| | soldering heat resistance (Sec.) | 120< | 120< | | | 120< |

What is claimed is:

1. An adhesive for copper foils, said adhesive consisting essentially of:

(I) a first amount of a non-modified epoxy resin and a second amount of a rubber-modified epoxy resin in a total amount of 60–100 parts by weight, wherein said second amount of said rubber-modified epoxy resin is 0.5 to 20 parts by weight;

(II) 5–30 parts by weight of a polyvinyl acetal resin; and optionally, (III) at least one resin selected rom the group consisting of blocked isocyanate resins, polyester resins, polyester resins, melamine resins and urethane resins.

2. An adhesive for copper foils according to claim 1 wherein the adhesive contains at least one resin selected from the group consisting of blocked isocyanate resins, polyester resins, polyester resins, melamine resins and urethane resins.

3. An adhesive for copper foils according to claim 1, wherein said rubber is a member selected from the group consisting of a butadiene rubber having a terminal carboxyl group, an acrylonitrile-butadiene copolymer, and an isoprene rubber.

4. An adhesive for copper foils according to claim 1, wherein said epoxy resin is a member selected from the group consisting of a bisphenol A epoxy resin, a bisphenol F epoxy resin, a novolak epoxy resin, an o-creosol novolak epoxy resin, a brominated epoxy resin, triglycidyl isocyanurate, tetrakis (glycidyloxyphenyl) ethane, an epoxidized polybutadiene, a glycidyl amine compound and a glycidyl ester compound.

5. An adhesive for copper foils according to claim 1, further consisting essentially of at least one curing agent for said epoxy resin, said curing agent being selected from the group consisting of dicyandiamide, organic hydrazides and imidazoles.

6. An adhesive for copper foils according to claim 1, further consisting essentially of at least one fire retardant selected from the group consisting of bromine compounds and antimony compounds.

7. An adhesive for copper foils according to claim 1, further consisting essentially of at least one inorganic filler selected from the group consisting of talc and powdered silica.

8. An adhesive-backed copper foil, wherein the adhesive backing consisting essentially of:

(I) a first amount of a non-modified epoxy resin and a second amount of a rubber-modified epoxy resin in a total amount of 60–100 parts by weight, wherein said second amount of said rubber-modified epoxy resin is 0.5 to 20 parts by weight;

(II) 5–30 parts by weight of a polyvinyl acetal resin; and optionally, (III) at least one resin selected from the group consisting of blocked isocyanate resins, polyester resins, polyester resins, melamine resins and urethane resins.

9. An adhesive-backed copper foil according to claim 8, wherein the adhesive contains at least one resin selected from the group consisting of blocked isocyanate resins, polyester resins, polyester resins, melamine resins and urethane resins.

10. An adhesive-backed copper foil according to claim 8, wherein said rubber is a member selected from the group consisting of a butadiene rubber having a terminal carboxyl group, an acrylonitrile-butadiene copolymer, and an isoprene rubber.

11. An adhesive-backed copper foil according to claim 8, wherein said epoxy resin is a member selected from the group consisting of a bisphenol A epoxy resin, a bisphenol F epoxy resin, a novolak epoxy resin, an o-creosol novolak epoxy resin, a brominated epoxy resin, triglycidyl isocyanurate, tetrakis (glycidyloxyphenyl) ethane, an epoxidized polybutadiene, a glycidyl amine compound and a glycidyl ester compound.

12. An adhesive-backed copper foil according to claim 5, said adhesive further containing at least one curing agent for said epoxy resin, wherein said curing agent is selected from the group consisting of dicyandiamide, organic hydraides and imidazoles.

13. An adhesive-backed copper foil according to claim 5, said adhesive further containing at least one fire retardant selected from the group consisting of bromine compounds and antimony compounds.

14. An adhesive-backed copper foil according to claim 5, said adhesive further containing at least one inorganic filler selected from the group consisting of talc and powdered silica.

* * * * *

UNITED STATES PATENT AND TRADEMARK OFFICE
CERTIFICATE OF CORRECTION

PATENT NO. : 5,707,729
DATED : January 13, 1998
INVENTOR(S) : Tetsuro SATOH It is certified that an error appears in the above-identified patent and that said Letters Patent is hereby corrected as shown below:

Abstract, line 2, replace "fist" with --first--; line 8, replace "rom" with --from--; line 9, delete "polyester resins" (second occurrence).

Claim 1, column 7, line 1, replace "rom" with --from--; lines 2 and 3, delete "polyester resins" (second occurrence).

Claim 2, column 7, line 7, delete "polyester resins" (second occurrence).

Claim 8, column 8, line 6, delete "polyester resins" (second occurrence).

Claim 9, column 8, line 11, delete "polyester resins" (second occurrence).

Claim 12, column 8, line 29, replace "organic hydraides" with --organic hydrazides--.

Signed and Sealed this

Seventh Day of July, 1998

*Attest:*

BRUCE LEHMAN

*Attesting Officer*    Commissioner of Patents and Trademarks